US011694971B1

(12) United States Patent
Coccioli et al.

(10) Patent No.: US 11,694,971 B1
(45) Date of Patent: Jul. 4, 2023

(54) ELECTRO-OPTIC PACKAGE FEATURING SPUTTERED EMI SHIELD

(71) Applicant: MARVELL ASIA PTE LTD., Singapore (SG)

(72) Inventors: Roberto Coccioli, San Jose, CA (US); Poorna Chander Ravva, San Jose, CA (US); Dwayne Richard Shirley, San Jose, CA (US); Jing Li, San Jose, CA (US); Shrinath Ramdas, San Jose, CA (US); Hassan Kobeissi, San Jose, CA (US); Shaohui Yong, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 39 days.

(21) Appl. No.: 17/229,491

(22) Filed: Apr. 13, 2021

(51) Int. Cl.
| | |
|---|---|
| *H01L 23/60* | (2006.01) |
| *H01L 23/552* | (2006.01) |
| *H01L 23/00* | (2006.01) |
| *H01L 23/31* | (2006.01) |
| *H01L 23/498* | (2006.01) |
| *H01L 21/48* | (2006.01) |
| *H01L 21/56* | (2006.01) |

(52) U.S. Cl.
CPC ........ *H01L 23/552* (2013.01); *H01L 21/4853* (2013.01); *H01L 21/4857* (2013.01); *H01L 21/565* (2013.01); *H01L 23/3128* (2013.01); *H01L 23/49822* (2013.01); *H01L 23/49838* (2013.01); *H01L 24/16* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS 9,984,983 B2 * 5/2018 Chung ................. H01L 21/565

* cited by examiner

*Primary Examiner* — Long Pham (57) ABSTRACT

Embodiments relate to a die package featuring a sputtered metal shield to reduce Electro-Magnetic Interference (EMI). According to a particular embodiment, a die featuring a top surface exposed by surrounding Molded Underfill (MUF) material, is subjected to metal sputtering. The resulting sputtered metal shield is in direct physical and thermal contact with the die, and is in electrical contact with a substrate supporting the die (e.g., to provide shield grounding). Specific embodiments may be particularly suited to reducing the EMI of a package containing an electro-optic die, to between 3-15 dB. The conformal nature and small thickness of the sputtered metal shield desirably conserves space and reduces package footprint. Direct physical contact between the shield and the die surface exposed by the MUF, enhances thermal communication (e.g., reducing junction temperature). According to certain embodiments, the sputtered metal shield comprises a stainless steel liner, copper, and a stainless steel coating.

12 Claims, 10 Drawing Sheets

Carina 11X12mm Package Simulation Parameters | | | Thermal Simulation Results | | |
|---|---|---|---|---|---|
| Assembly Technology | Case Temperature (°C) | Total Non-Uniform Power | Junction Temperature (°C) | Theta-JC (°C/W) | Change in Junction Temperature | Change in Theta-JC |
| Four Corner LID Package | 80 | 19.45 W | 97.4 | 0.9 | | |
| NUF + ED Package | 80 | | | | -8.5 % Decrease | -4.4 % Decrease |

ELECTRO-OPTIC PACKAGE FEATURING SPUTTERED EMI SHIELD

BACKGROUND

The present invention is directed to communication systems and methods.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. To move a large amount of data, optical communication networks are often used.

With high demand for communication networks came high demand for quality networking devices. However, such devices are typically located internal to other components (e.g., servers), and must be packaged in a manner complying with applicable Electro-Magnetic Interference (EMI) requirements.

SUMMARY

Embodiments relate to a die package featuring a sputtered metal shield to reduce Electro-Magnetic Interference (EMI). According to a particular embodiment, a die featuring a top surface exposed by surrounding Molded Underfill (MUF) material, is subjected to metal sputtering. The resulting sputtered metal shield is in direct physical and thermal contact with the die, and is in electrical contact with a substrate supporting the die (e.g., to provide shield grounding). Specific embodiments may be particularly suited to reducing the EMI of a package containing an electro-optic die, to between about 3-15 dB. The conformal nature and small thickness of the sputtered metal shield desirably conserves space and reduces package footprint. Direct physical contact between the shield and the die surface exposed by the MUF, enhances thermal communication (e.g., reducing junction temperature). According to certain embodiments, the sputtered metal shield comprises copper, and may further include a stainless steel coating.

Embodiments achieve these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DESCRIPTION

The present invention is directed to communication systems and methods. According to embodiments, methods and apparatuses of electro-optic device packaging are provided.

Figure 1:
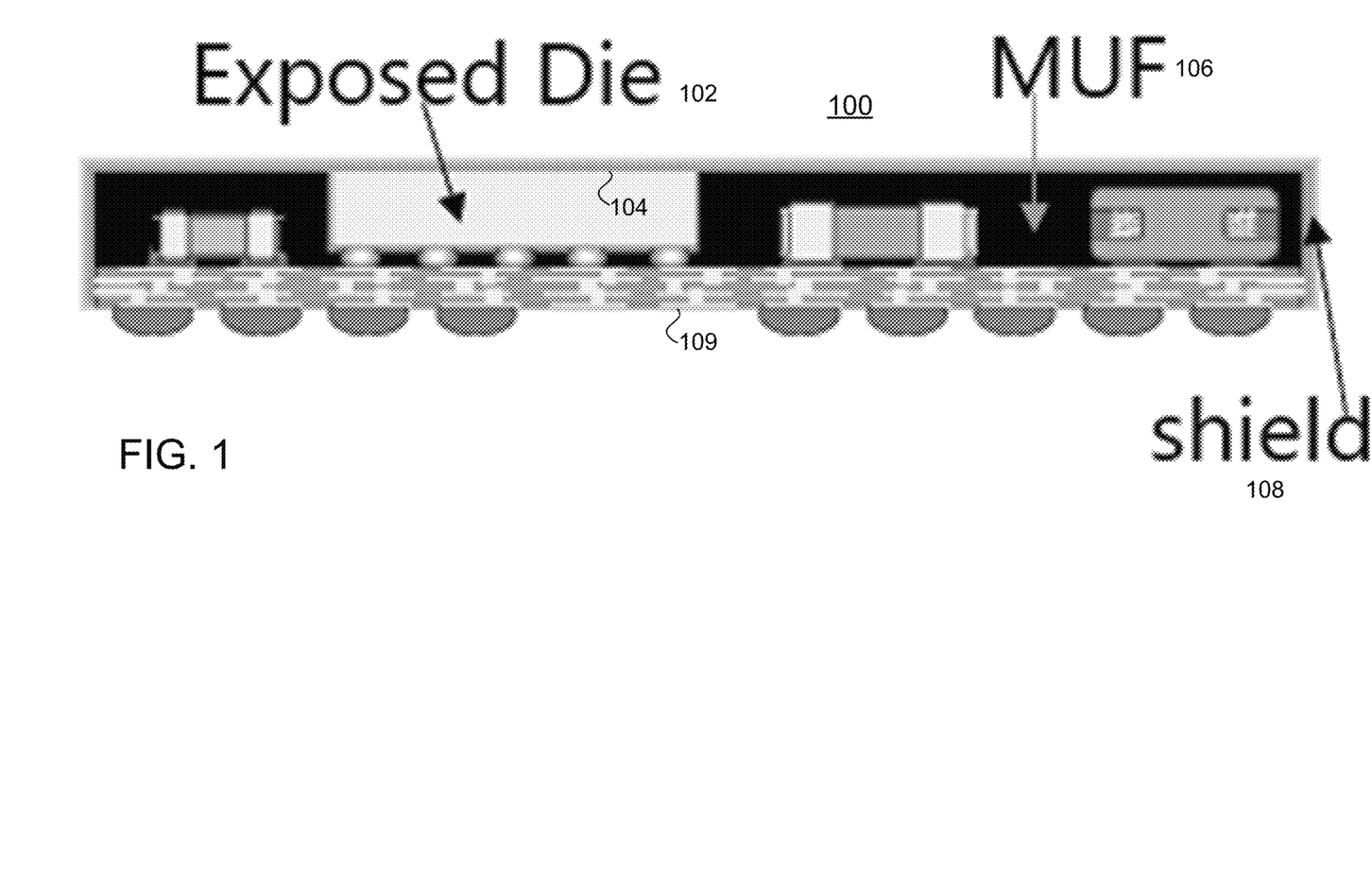
FIG. 1 is a simplified cross-sectional view of a package according to an embodiment.

FIG. 1 shows a simplified cross-sectional view of an electro-optics package according to an embodiment. The package 100 includes a die 102 with a top surface 104 that is exposed within a mold material 106.

According to certain embodiments, the mold material may be a Molded Underfill (MUF) material. In some embodiments, Capillary UnderFill (CUF) mold material may be used.

According to some embodiments, the die may be an opto-electric die that is configured to communicate both electronic and optical signals. However, embodiments are not limited to the die being of any particular type, size, or form factor.

The MUF and the exposed top die surface are coated with a thin metal shield 108 that is formed by sputtering. In certain embodiments, the thin metal shield may comprise copper and/or other metals.

The package further comprises a substrate 109. Conductive portions of the substrate are in electrical contact with the shield. This may be to provide grounding and/or complete a circuit.

Figure 1A:
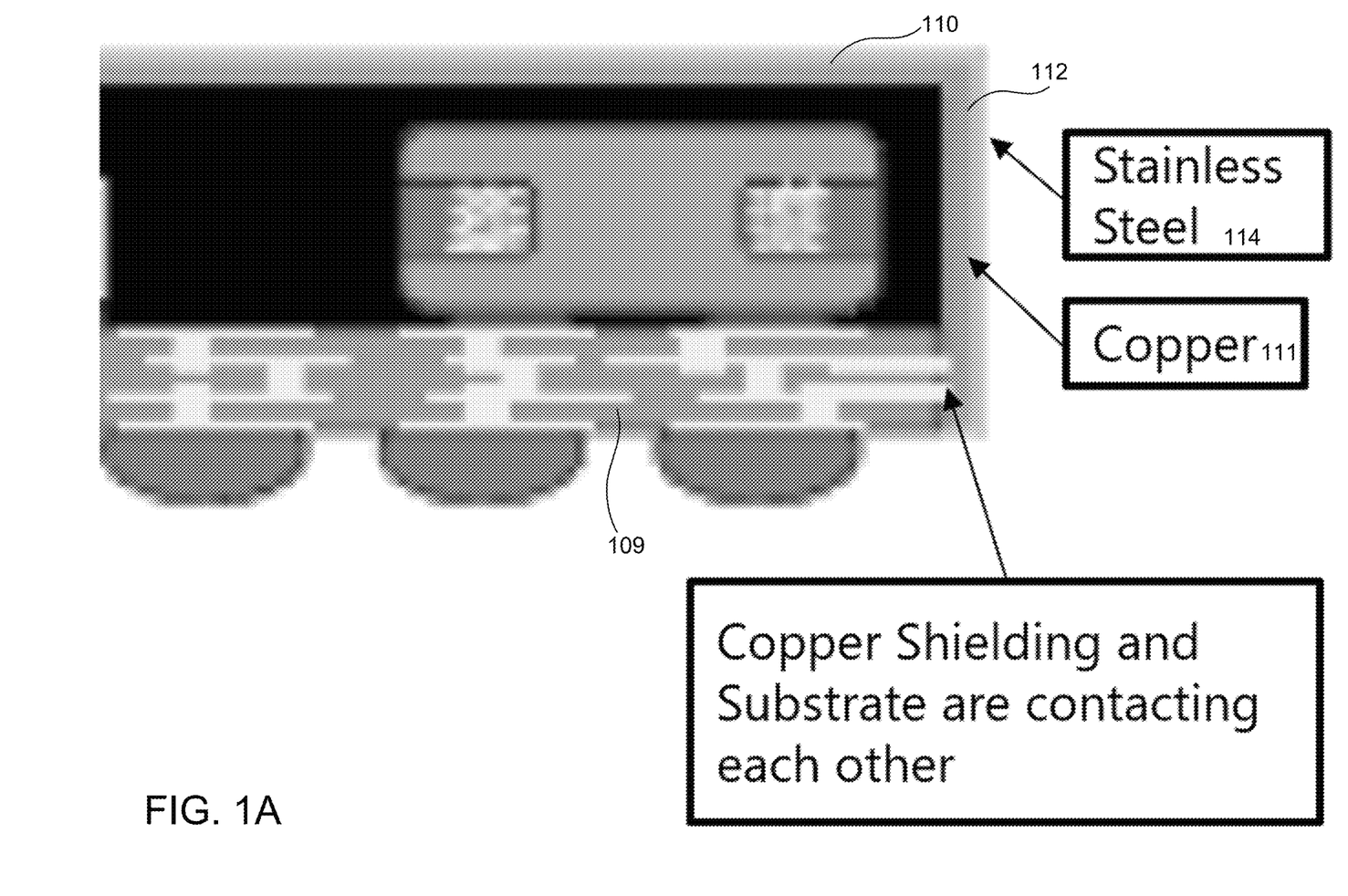
FIG. 1A shows an enlargement of a right hand side of the view of FIG. 1.

FIG. 1A shows an enlargement of a right hand side of the view of FIG. 1. In some embodiments, a top portion 110 of a sputtered shield comprising copper metal 111, has a thickness of between about 4-6 µm. This sputtered shield is conformal to the MUF, with a side portion 112 having a thickness of about 2 µm.

As shown in FIG. 1A, the shield further includes another sputtered layer 114. This is a thin layer 0.01-0.5 µm of stainless steel that is applied over the copper, in order to prevent oxidation and inhibit corrosion thereof.

Again, the copper portion of the shield is touching the copper layer from the substrate at the lower corner of the package, thereby completing the circuit.

EXAMPLE

Figure 2:
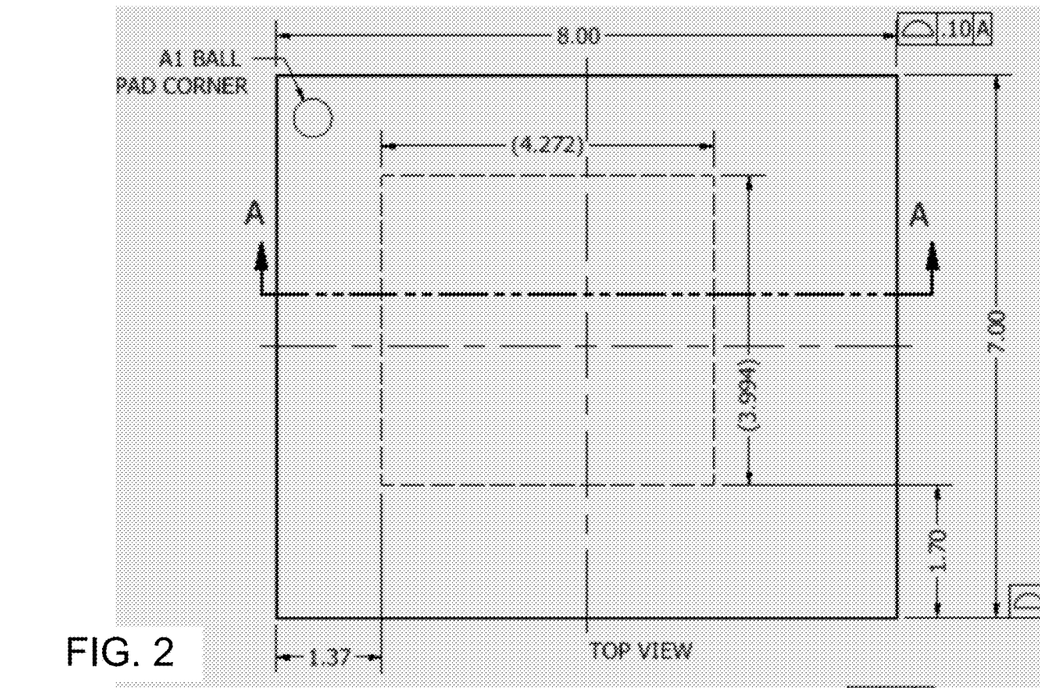
FIG. 2 is a simplified plan view of a package according to an exemplary embodiment.

FIG. 2 is a simplified plan view of one specific package according to an exemplary embodiment. Sample dimensions are shown confirming to ASME Y14.5-2018. However, package embodiments are not limited to these or any other particular dimensions.

Figure 3:
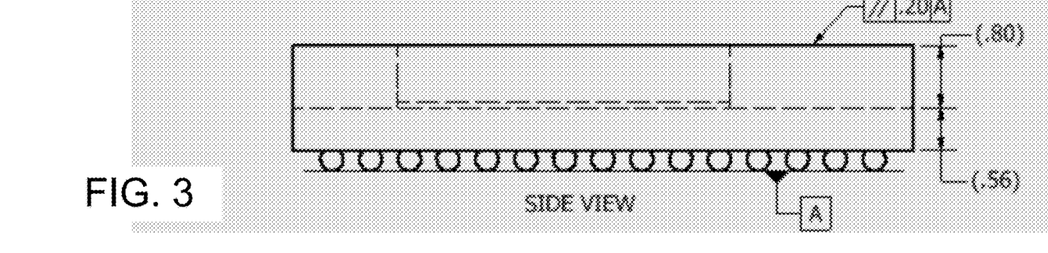
FIG. 3 shows a simplified side view of the exemplary embodiment.
Figure 4:
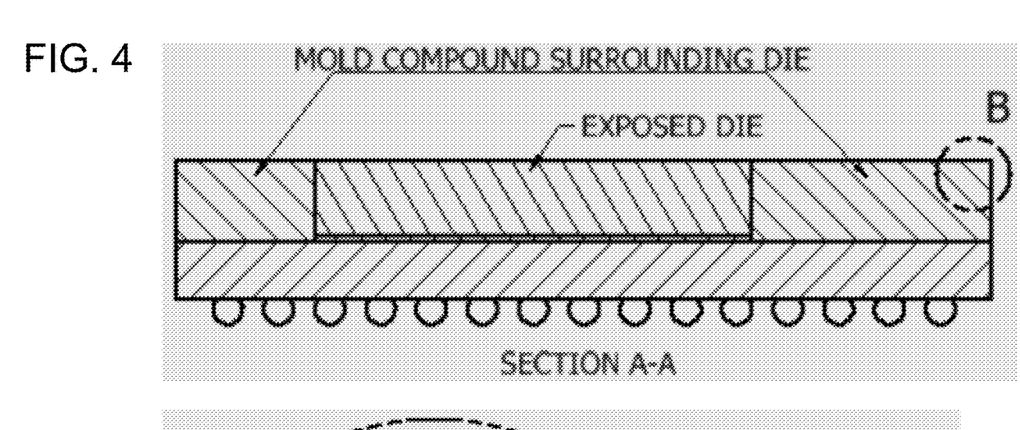
FIG. 4 is a simplified cross-section of the exemplary embodiment.

FIG. 3 shows a simplified side view of the exemplary embodiment. FIG. 4 is a simplified cross-section of the exemplary embodiment.

Figure 5:
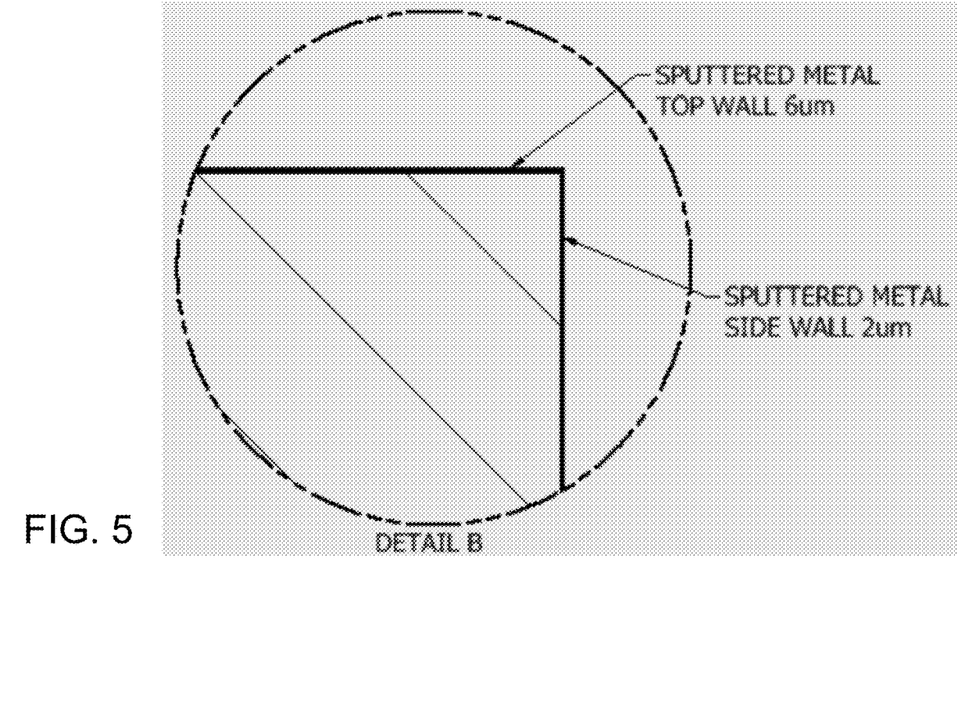
FIG. 5 shows an enlarged detail of FIG. 4.

FIG. 5 shows an enlarged detail of the cross-sectional view of FIG. 4. The thickness of the sputtered copper is 6 µm on the top, and 2 µm on the sides.

Such a conformal sputtered metal shield coating as provided by embodiments, offers a more compact footprint than a conventional shield. In particular, a conventional top hat or conventional four corner lid structure may have a typical thickness of about 60-70 µm, requiring lateral spacing of at least double that size to be present on either side of the package.

Moreover, the sputtered conformal metal shield according to an embodiment offers enhanced performance as compared with a conventional package. Simulation of EMI performance for a far field evaluation, indicates the favorable properties of a package according to an embodiment.

Figure 6:
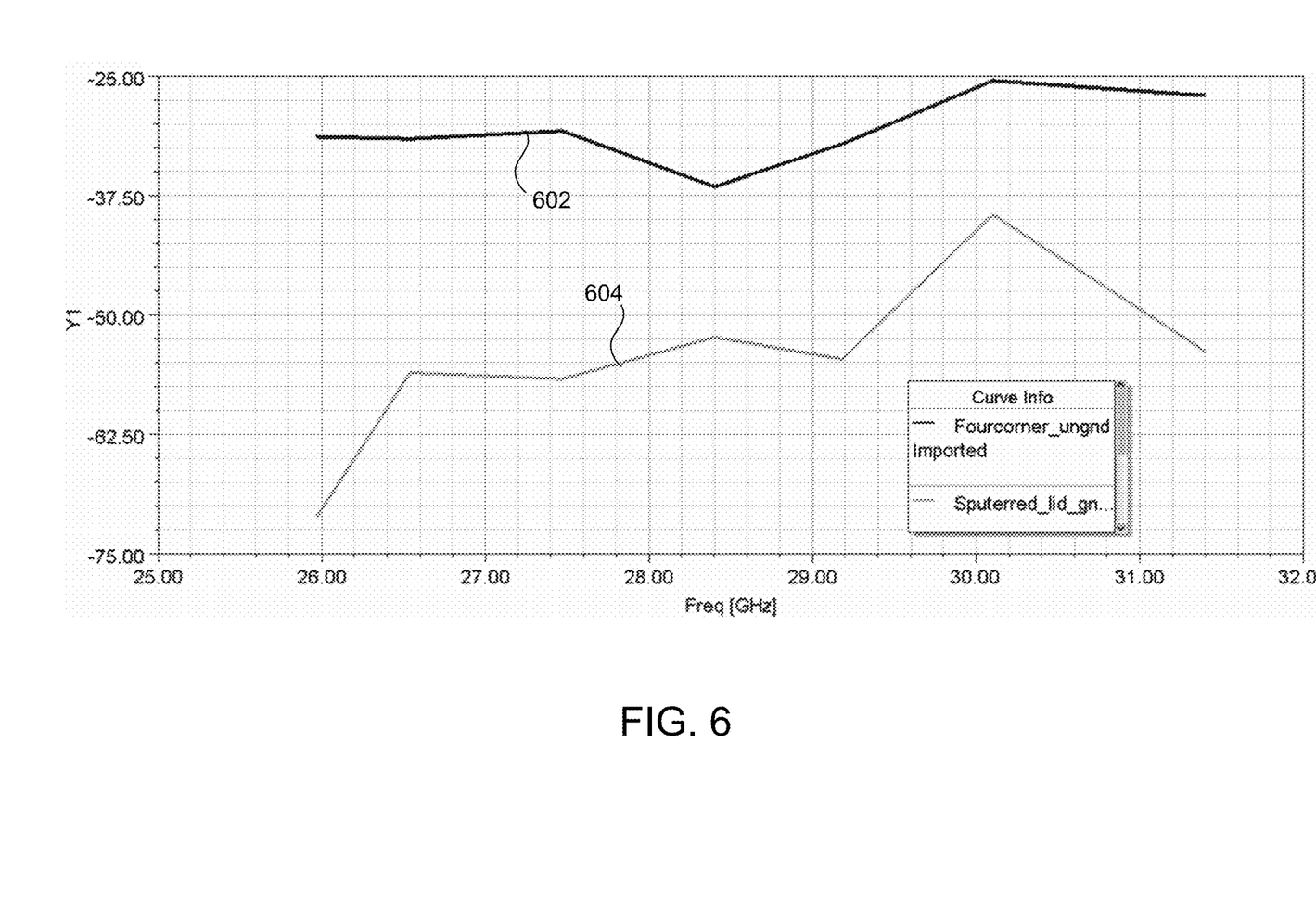
FIG. 6 plots EMI versus frequency for certain package types.

In particular, FIG. 6 plots simulated EMI (in dB×V/meter) versus frequency (GHz), for a conventional four corner lid 602 package design, compared to a package design according to an embodiment 604 featuring an exposed die and sputtered shield. FIG. 6 shows 10+dB EMI reduction in far field in full wave simulation.

Figure 7:
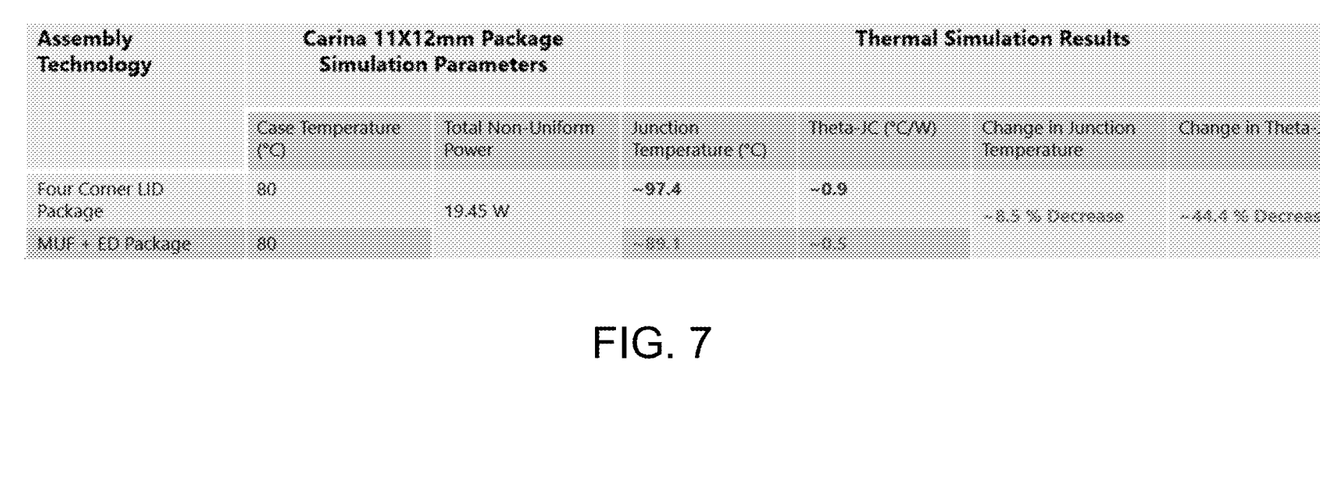
FIG. 7 shows a table listing properties of an exemplary package.

FIG. 7 lists properties of an exemplary package. This table shows a favorable decline in junction temperature, as compared with a conventional four cornered lid package.

Figure 8:
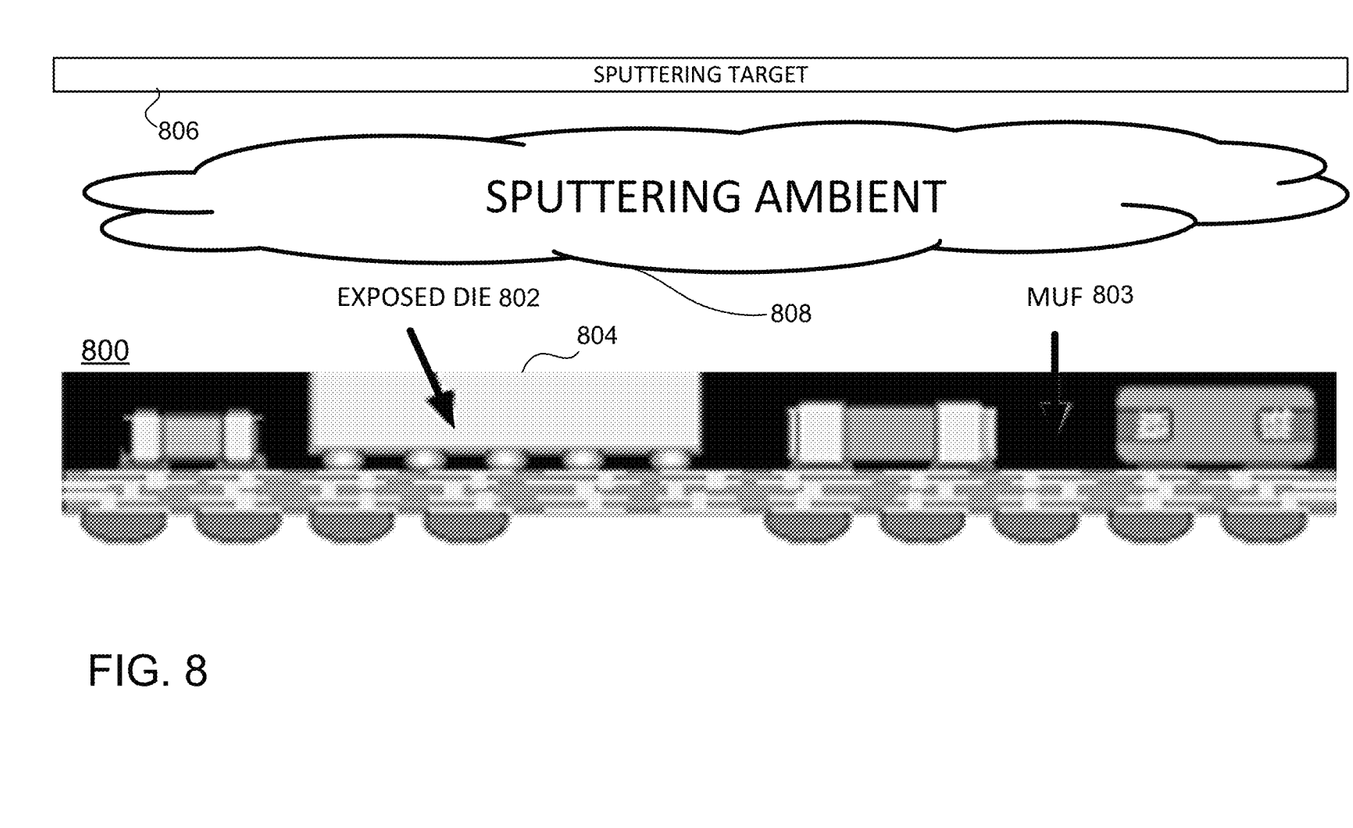
FIG. 8 shows a simplified schematic view of the formation of a package according to an embodiment.

FIG. 8 is a simplified schematic view illustrating the formation of a package according to an embodiment. Specifically, a package 800 comprising a die 802 having sides encased within MUF molding material 803 and an exposed top surface 804, is positioned within an environment including a sputtering target 806 and a sputtering ambient 808.

Figure 9A:
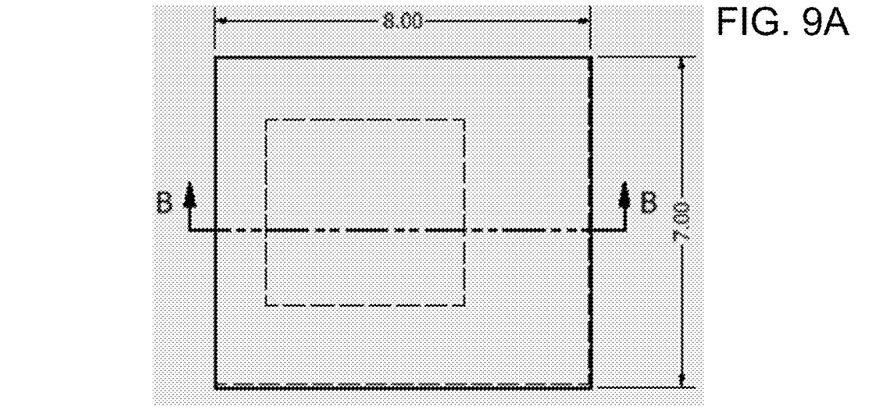
FIGS. 9A-9C show various different views illustrating the grounding of a package according to an exemplary embodiment.
Figure 9B:
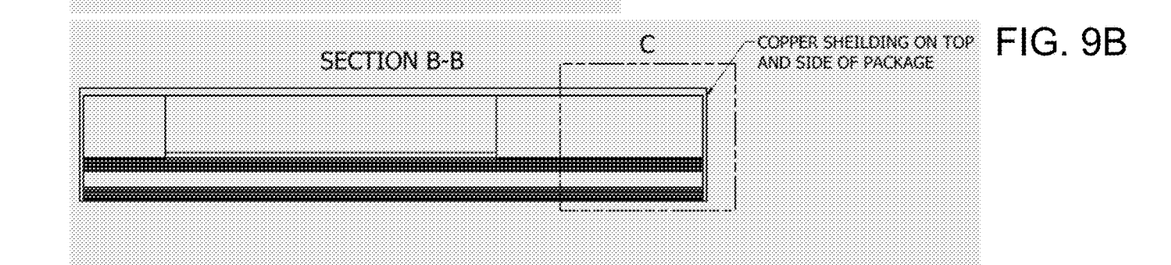
Figure 9C:
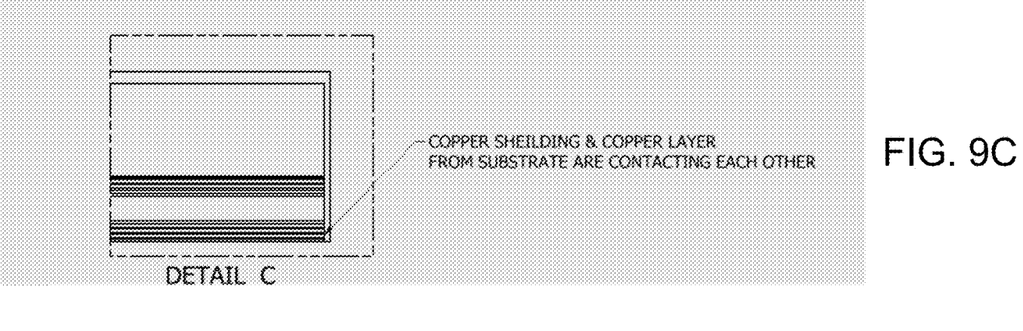

FIGS. 9A-9C are various different views illustrating the grounding of a package according to an exemplary embodiment. In particular, FIG. 9A shows a plan view, FIG. 9B shows a cross-section, and FIG. 9C shows an enlargement of the cross-section of FIG. 9B.

Here, the puttered metal is Copper. Top wall thickness is 6 µm & side wall thickness is 2 µm. Copper shielding is touching the copper layer from substrate and is connected to ground and thus completing the circuit. Copper shielding and substrate copper layer are touching each other at exterior surface shown in Detail C of FIG. 9C. There is single contiguous sheet of copper on top and side on the package as shown in Section B-B view of FIG. 9B.

Figure 10:
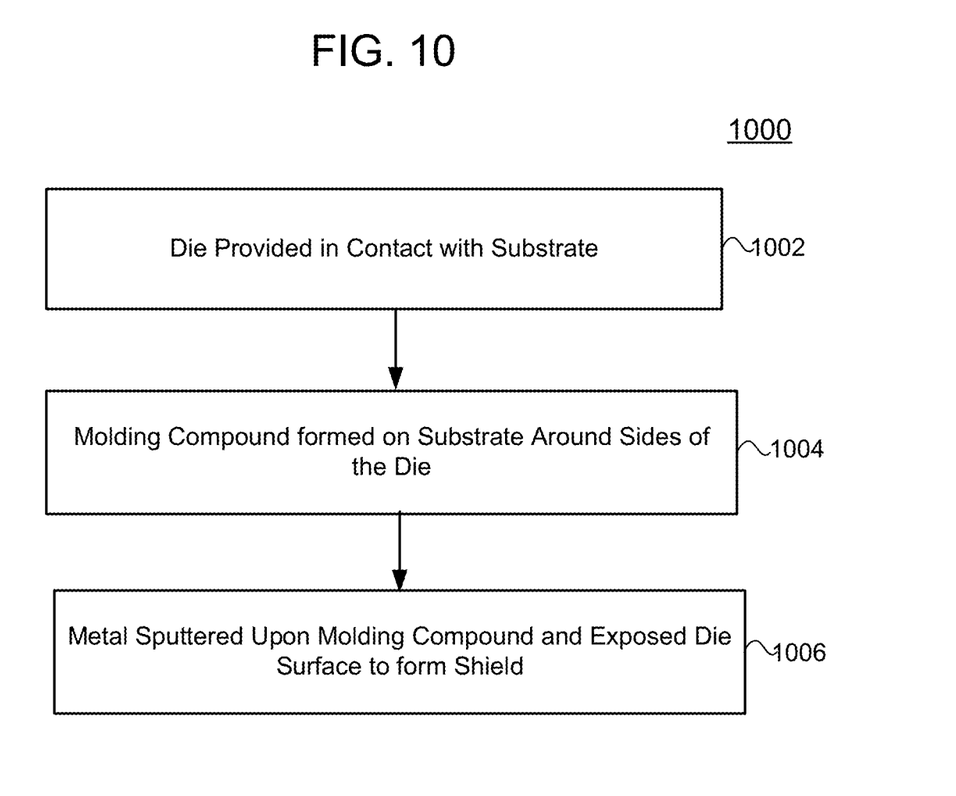
FIG. 10 is a simplified flow diagram of a method of package fabrication according to an embodiment.

FIG. 10 is a simplified flow diagram of a method of package fabrication 1000 according to an embodiment. At 1002, a substrate is provided having a die in contact therewith.

At 1004, a molding compound is formed around sides of the die, leaving a top surface of the die exposed. At 1006, the molding compound and an exposed top surface of die are subjected to metal sputtering process(es) to form a shield.

As mentioned above, according to some embodiments the sputtering can take place in several phases. For example, first stainless steel may be sputtered on top of the package to form a liner, then copper is sputtered, and then again stainless steel is sputtered on top of the copper to form a coating.

In conclusion, an embodiment of a new package technology as shown in FIG. 1 that features MUF+exposed die+ conformal sputtered metal coating, may exhibit a number of benefits. These can include but are not limited to:

more than 10 dB EMI improvement in both measurement and simulation as compared to a conventional four corner lid package;

thermal performance improvement as compared to a MUF package;

reduced package size by using MUF technology;

reduction in cost due to the assembly in strip format.

Regarding the cost reduction, a strip assembly process is batch process. So more packages can be handled at once, and multiple units are assembled at a time in strip assembly as compared to a singulated device. Hence, assembly in strip format is cost effective.

Figure 11:
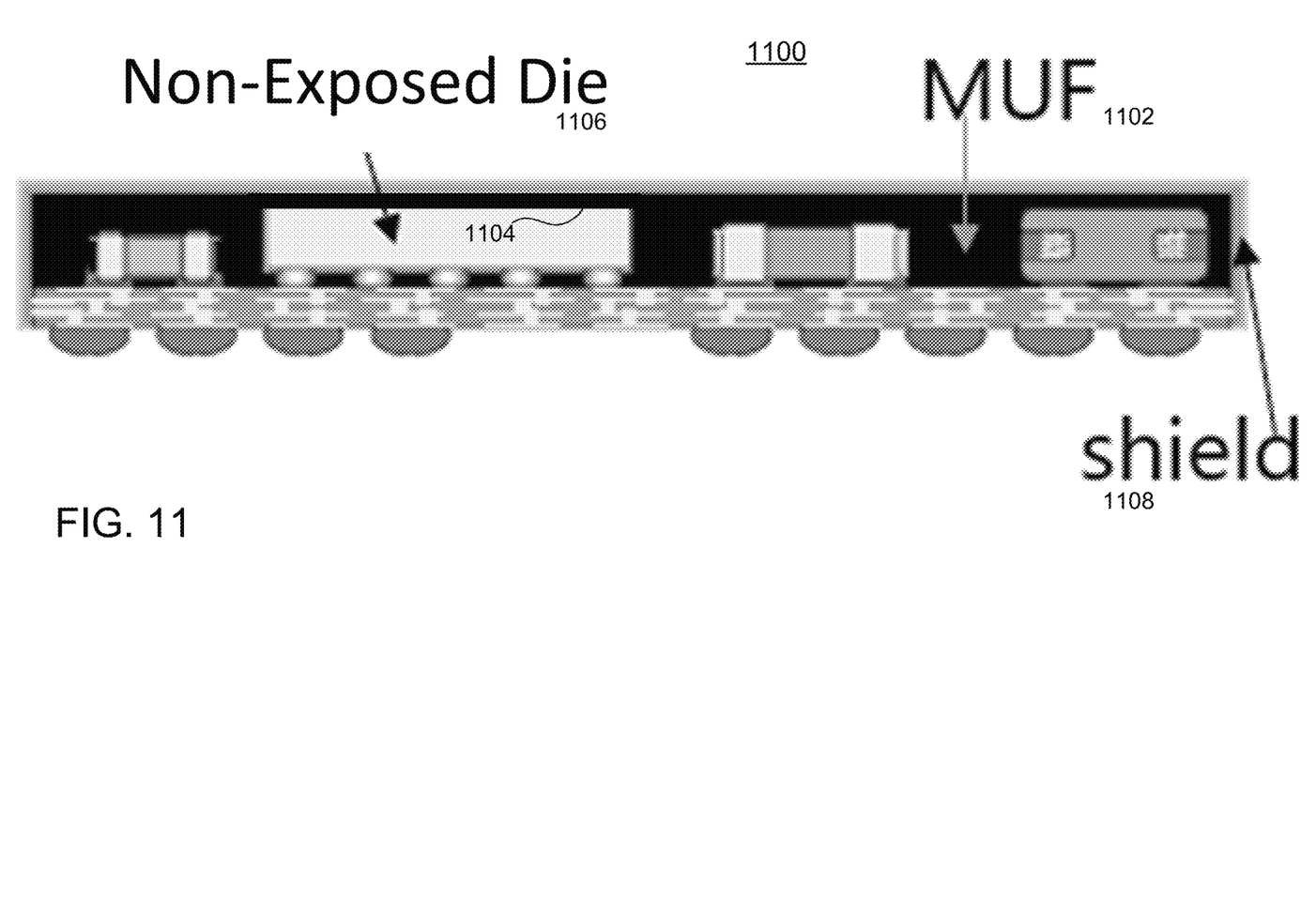
FIG. 11 is a simplified cross-sectional view of a package according to an alternative embodiment.

It is noted that embodiments do not require the use of an exposed die. According to alternative embodiments, a package having a die with some amount of molding material present on the top surface, could be used. FIG. 11 shows a simplified view of such an embodiment 1100, where some volume of MUF 1102 is present between the top surface 1104 of die 1106 and the shield 1108.

Given the various applications and embodiments as described herein, the above description and illustrations should not be taken as limiting the scope of the present invention which is defined by the appended claims.

What is claimed is:

1. A packaged electronic device comprising:
   a substrate in electrical contact with a die;
   a mold compound in contact with the substrate and with one or more sides of the die; and
   a sputtered metal shield comprising a first layer of a first metal and a second layer of a second metal formed on the first layer, the sputtered metal shield being applied by sputtering and being in contact with the mold compound and with the substrate and extending to a bottom surface of the substrate.

2. The packaged electronic device of claim 1 wherein at least one of the sides of the die is in physical contact with the sputtered metal shield without the mold compound being disposed between the at least one of the sides of the die and the sputtered metal shield.

3. The packaged electronic device of claim 1 wherein the die is an electro-optic die.

4. The packaged electronic device of claim 3 wherein operation of the electro-optic die results in an Electro-Magnetic Interference (EMI) of between about 3-15 dB.

5. The packaged electronic device of claim 1 wherein the mold compound comprises molded underfill (MUF) material.

6. The packaged electronic device of claim 1 wherein the sputtered metal shield comprises copper.

7. The packaged electronic device of claim 1 wherein the sputtered metal shield comprises:
   a top portion having a first thickness; and
   a side portion having a second thickness smaller than the first thickness.

8. The packaged electronic device of claim 7 wherein:
   the sputtered metal shield comprises copper;
   the first thickness is approximately 6 µm; and
   the second thickness is approximately 2 µm.

9. The packaged electronic device of claim 1 wherein the sputtered metal shield comprises a plurality of metal layers of at least two different metallic materials.

10. The packaged electronic device of claim 9 wherein the first layer of the sputtered metal shield comprises copper, and the second layer of the sputtered metal shield comprises stainless steel.

11. The packaged electronic device of claim 1 wherein the die is not in physical contact with the sputtered metal shield.

12. The packaged electronic device of claim 1 wherein the sputtered metal shield contacts a portion of the die and conducts heat away from the die.

\* \* \* \* \*